(12) United States Patent
Yamazaki et al.

(10) Patent No.: US 9,513,676 B2
(45) Date of Patent: Dec. 6, 2016

(54) ELECTRONIC DEVICE AND EXTENSION UNIT FOR ELECTRONIC DEVICE

(71) Applicant: A&D Company, Limited, Tokyo (JP)

(72) Inventors: Makoto Yamazaki, Kitamoto (JP); Toyohiko Akazawa, Kitamoto (JP); Akio Yoshikawa, Kitamoto (JP); Hajime Takeo, Kitamoto (JP)

(73) Assignee: A&D Company, Limited, Tokyo (JP)

( * ) Notice: Subject to any disclaimer, the term of this patent is extended or adjusted under 35 U.S.C. 154(b) by 0 days.

(21) Appl. No.: 14/950,151

(22) Filed: Nov. 24, 2015

(65) Prior Publication Data

US 2016/0170453 A1 Jun. 16, 2016

(30) Foreign Application Priority Data

Dec. 11, 2014 (JP) ................................. 2014-250475

(51) Int. Cl.
*H05K 7/14* (2006.01)
*G06F 1/18* (2006.01)

(52) U.S. Cl.
CPC .............. *G06F 1/185* (2013.01); *G06F 1/183* (2013.01)

(58) Field of Classification Search
CPC ........ G06F 1/187; G06F 1/183; G06F 1/185; G06F 1/186; G06F 1/1601; G06F 1/184
USPC ...................................................... 361/679.4
See application file for complete search history.

(56) References Cited

U.S. PATENT DOCUMENTS 9,395,772 B2 * 7/2016 Degner ..................... G06F 3/00

FOREIGN PATENT DOCUMENTS

| JP | 03-109798 | 5/1991 |
| JP | 06-195153 | 7/1994 |
| JP | 08-221154 | 8/1996 |
| JP | 11-340643 | 12/1999 |
| JP | 2007-165128 | 6/2007 |
| JP | 2008-287309 | 11/2008 |

OTHER PUBLICATIONS

Office Action issued by the Japanese Patent Office Japanese Applicatio 2014250475 (JP 5748252) on Mar. 10, 2015.

* cited by examiner

*Primary Examiner* — Jinhee Lee
*Assistant Examiner* — Ingrid Wright
(74) *Attorney, Agent, or Firm* — Roberts Mlotkowski Safran Cole & Calderon, PC

(57) ABSTRACT

To provide an electronic device in which a CPU unit and an arbitrary number of IO units can be connected by stacking without the ineffective size increase of the entire device, and the easy unlocking is possible. The CPU unit 13 and the IO unit 15 are connected by inserting a pair of edge connecters 63, 65 formed at both ends of a riser board 61 into an edge-connector socket 33 formed in a first board 31 of the CPU unit 13 and into an edge-connector socket 57 formed in a second board 51 of the CPU unit 13, and the first board 31 and the second board 51 are electrically connected through the riser board 61.

4 Claims, 7 Drawing Sheets

ELECTRONIC DEVICE AND EXTENSION UNIT FOR ELECTRONIC DEVICE

TECHNICAL FIELD

The present invention relates to an electronic device including a plurality of units, and an extension unit for the electronic device, and more in detail, to the electronic device in which an arbitrary number of the extension units can be added for function enhancement without ineffectively enlarging the entire device, and to the extension unit.

BACKGROUND ART

An electronic device such as a personal computer (PC) may enlarge the performance and the function by adding an extension unit depending on a user's purpose and a usage.

The electrode terminal of the extension unit is inserted into an extension slot formed in a motherboard mounted on the electronic device such as PC. A variety of the extension units are available depending on usages. A variety of fixing positions and fixing methods exist depending on a kind of an enlargement slot to which the extension unit is connected, and on a structure of housing.

PRIOR TECHNICAL PUBLICATIONS

Patent Publications

Patent Publication 1: JP-A-11-340643
Patent Publication 2: JP-A-6-195153

SUMMARY OF INVENTION

Problems to be Solved by Invention

A riser board (or riser card) is ordinarily used for mounting an extension unit to a motherboard. For example, in an electronic device described in Patent Publication 1 respective extension units are connected to a riser board by inserting edge connectors formed on one end of the board in the extension unit into a plurality of slots formed on the side surface of the riser board accommodating the vertical riser board.

However, in this method, the number of the slots formed on the riser board is fixed in advance so that a superfluous slot exists when the number of the required extension units is smaller than the number of the slots, resulting in the waste of space. Reversely, when the number of the required extension units is larger than the number of the slots, a part of the extension unit cannot be connected so that the required performance and function cannot be obtained. Further, a larger space is necessary so that the size of the device is increased because the extension unit and the motherboard are connected to the riser board unit lying horizontally.

In order to overcome the above-mentioned problem about the number of the slots, an electronic device is described in Patent Publication 2 in which a plurality of extension units are stacked in a vertical direction without use of slots. In this electronic device, the connection between respective option modules and a connector-mounting stand is performed by inserting a convex connector into a concave connector. Accordingly, no space is necessary for the option modules. However, the size of the whole electronic device is increased because the respective option modules are stacked on the connector-mounting stand of the electronic device having an area several times larger than that of the modules. Since the convex connectors and the concave connectors of the electronic device are an ordinary connector structure in which the connectors are connected by means of a pin, there arises a problem that the connecting force increases with the increase of the number of terminals to be connected so that a simple detachment can be hardly achieved.

An object of the present invention is to provide an electronic device in which an arbitrary number of motherboards and extension units for function enhancement can be stack-connected and easily detached with certainty without ineffectively enlarging the entire device, and to provide the extension unit.

Means of Solving Problems

The electronic device of the present invention (Claim 1) for achieving the above object has the configuration of an electronic device including a first unit accommodating a first board, a second unit accommodating a second board and having a substantially same planar shape as that of the first unit, a riser board having a pair of edge connectors at both ends, one of which is inserted into a first edge-connecter socket of the first board through a first opening formed in the first unit, and the other of which is inserted into a second edge-connecter socket of the second board through a second opening formed in the second unit, for connecting the first board and the second board, a plurality of engaged sections formed on one of opposing surfaces of the first unit and the second unit, a plurality of engaging sections having nails, of which a number is same as those of the engaged sections, formed on the other of the opposing surfaces which can be engaged with the engaged sections, and an operation button for synchronously sliding the nails, the operation button detaching the respective nails engaged in the engaged sections therefrom, and the respective nails pushing the first unit and the second unit in a direction for separating the both units, together with the above detaching.

Functions

No elements other than the respective units are horizontally present outside of the units so that no horizontal surplus space is required because the riser board vertically connects the first board accommodated in the first unit and the second board accommodated in the second unit, and the planar shapes of the respective units are substantially the same.

In accordance with the present invention, the respective units are connected to each other by inserting the edge connectors of the riser board into the edge-connector sockets. Accordingly, the respective units can be easily connected with a smaller force, and the unlocking of the respective units can be also performed easily with a smaller force.

The present invention can be used for the electric connection between the CPU unit (main unit) and the IO unit (extension unit), and between the IO units. Accordingly, there are one case where the first unit is the CPU unit and the second unit is the IO unit, and another case where both of the first and second units are the IO units. Each of the units is ordinarily disposed in a horizontal direction, however, the present invention is not restricted thereto. Each of the units may be disposed in a vertical direction or a diagonal direction. Also in these cases, no surplus spaces in the horizontal or the diagonal direction are required.

When the first unit and the second unit are integrated by means of engagement, the nails are engaged to the engaged sections for firmly holding the first unit and the second unit, and the both edge connecters of the riser board are connected to the both boards through the both edge-connecter sockets so that the both boards are electrically connected to each other. The operation button is arranged to unlock the engagement between the nails and the engaged sections. The operation button easily separates the first unit and the second unit by means of the nails which press the opposite surface. On this occasion, the synchronous sliding of the nails can separate the first unit and the second unit while the both units are maintained parallel.

Claim 2 is configured to include a third opening on the opposite of the second opening of the second unit, which is closed with a lid.

Functions

The third opening in the second unit can connect an additional unit to the second unit. The lid made of an elastic element such as rubber closes the third opening so that the contamination due to dust may be prevented when the opening is not under use.

Claim 3 is configured to include a concave trench having the same shape as the third opening formed in the second unit.

Functions

In this embodiment, the concave trench having the same shape as that of the opening is formed so that the lid can be fitted in the concave trench when the opening is used.

In claim 4, an extension unit for an electronic device is provided which includes a board having an upward-oriented edge-connector socket and a downward-oriented edge-connector socket at top and bottom corresponding positions, openings above and below the both edge-connector sockets, a riser board which is inserted into the upward-oriented edge-connector socket, includes edge connectors at both ends and passes through the top opening for extending upward, a plurality of engaged sections formed on a top surface or a bottom surface of the unit, a plurality of engaging sections having nails, of which a number is same as those of the engaged sections, formed on the other surface which can be engaged with the engaged sections, and an operation button for synchronously sliding the plurality of the nails.

Functions

This extension unit is employable in the electronic device of claims 1 to 3, and includes the above functions.

Effect of Invention

In the electronic device of the present invention, the first board accommodated in the first unit (CPU unit, for example) and the second board accommodated in the second unit (IO unit, for example) can be electrically connected through the riser board. On this occasion, the required unit may be connected depending on necessity so that the ineffective size increase of the entire device can be prevented. The configuration in which the units are directly connected through the riser board can connect an arbitrary number of units by means of stacking. Further, the first unit and the second unit are firmly held by means of the nails which are engaged in the engaged sections, and can be easily separated by the operation of the operation button.

EMBODIMENTS FOR IMPLEMENTING INVENTION

The embodiments of the present invention will be described in detail.

Figure 1:
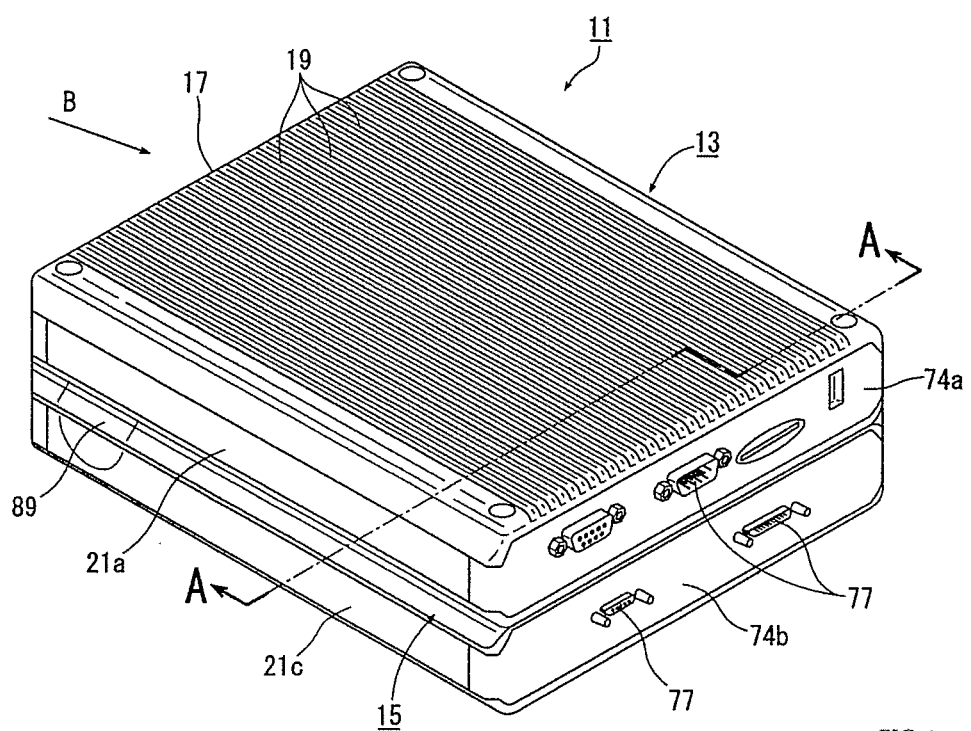
FIG. 1 A perspective view showing an electronic device in accordance with an embodiment of the present invention.

As shown in FIG. 1, an electronic device 11 is configured mainly by a top CPU unit 13 and a bottom IO unit 15. The CPU unit 13 and the IO unit 15 are connected to each other in FIG. 1, and these may be unlocked depending on necessity.

The housing of the CPU unit 13 is made of insulating material such as plastics, and plenty of parallel trenches 19 for heat dissipation are formed on the top board 17 of the housing. Both ends of the horizontal direction project downward, and both of the projections are engaged with respective top ends of side walls 21a 21b The bottom ends of the side walls 21a 21b are engaged with a bottom board 23 (refer to FIG. 2). A front board 74a and a rear board (not shown) are mounted on the front side and the rear side, respectively, of the housing, and are engaged with the top board 17 and the bottom board 23. Plenty of interfaces 77 are equipped on the front board 74a and another interfaces (not shown) are equipped on the rear board.

Figure 2:
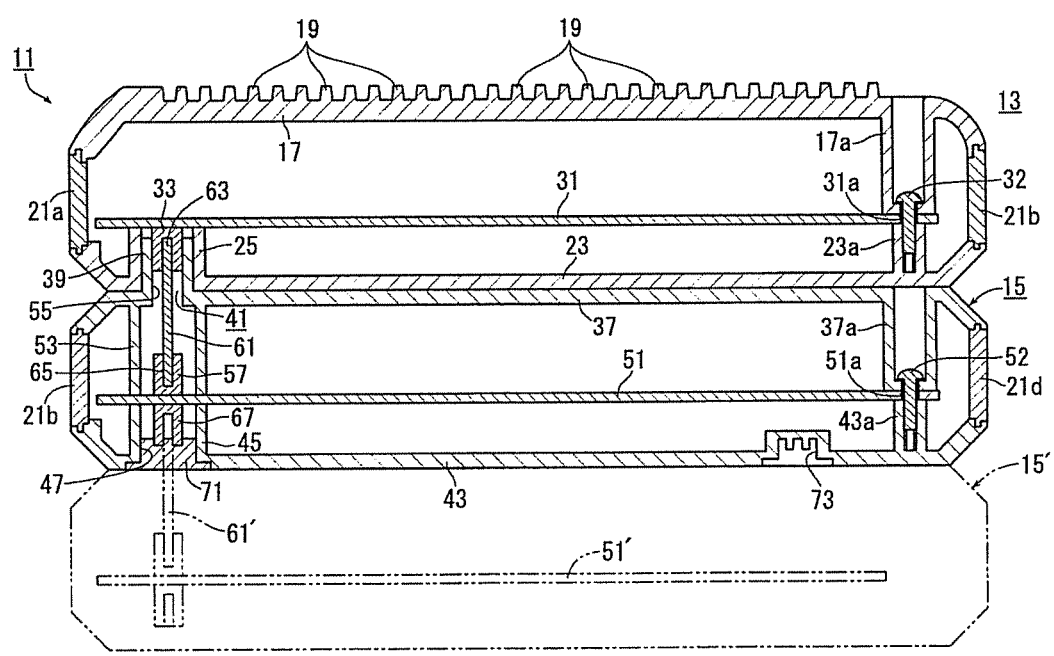
FIG. 2 A sectional view taken along a line A-A of FIG. 1.

As shown in the sectional view of FIG. 2, a first board 31 is accommodated in the CPU unit 13. The four corners of the first board 31 which is positioned between concaves 17a (only one concave is shown in FIG. 2, and the same is applied hereinafter) and projecting sections 23a of the bottom board 23 are fixed with screws 32. Specifically, the rounded concaves 17a are formed at the four corners of the top board 17, and apertures are formed through the bottom surfaces of the concaves 17a The upward protruded projecting portions 23a are formed at the corresponding portions of the bottom board 23, and screw apertures are formed above the projecting portions 23a. Apertures 31a are formed at the corresponding positions of the four corners of the first board 31. Accordingly, the top board 17, the first board 31 and the bottom board 23 are simultaneously fixed by aligning the positions of the projecting portions 23a of the bottom board 23 with the positions of the apertures 31a of the first board 31 and of the concaves 17a of the top board 17, and by fastening the screws 32.

A downward-oriented edge-connector socket 33 is formed on the bottom surface of the first board 31. An elongated first opening 41 is formed in the bottom board 23 in line with the edge-connector socket 33, and a first guide piece 25 inwardly (upwardly) projects around the first opening 41. The first guide piece 25 is positioned keeping a space with respect to the edge-connector socket 33 such that a second guide piece 39 hereinafter described can enter into this space. The edge-connector socket 33 is an ordinary electronic device, and a riser board 61 hereinafter described can be inserted into the socket 61 and clamped therein. The edge-connector socket 33 includes therein plenty of terminals (not shown) through which the riser board 61 and the first board 31 are electrically connected to each other by means of the contact between the terminals in the edge-connector socket 33 and the terminals of the riser board 61.

On the other hand, the housing of the IO unit 15 is, similarly to the CPU unite 13, made of insulating material such as plastics. As shown in FIG. 1, the dimension of the housing of the IO unit 15 is nearly the same as that of the housing of the CPU unit 13 in the plan view. As shown in FIG. 2, both ends of the horizontal direction of the top board 37 of the housing project downward, and both of the projections are engaged with respective top ends of side walls 21c 21d The bottom ends of the side walls 21c 21d are engaged with the bottom board 43. As shown in the broken view of FIG. 4, a front board 74b and a rear board 74d are mounted on the front side and the rear side, respectively, of the housing, and are engaged with the top board 17 and the bottom board 23. Plenty of interfaces 77, 79 are equipped on the front board 74b and the rear board 74d.

A second board 51 is accommodated in the housing. The four corners of the second board 51 which is positioned between concaves 37a of the top board 37 and projecting sections 43a of the bottom board 43 are fixed with screws 32. Specifically, the rounded concaves 37a are formed at the four corners of the top board 37, and apertures are formed through the bottom surfaces of the concaves 37a The upward protruded projecting portions 43a are formed at the corresponding portions of the bottom board 43, and screw apertures are formed above the projecting portions 43a Apertures 51a are formed at the corresponding positions of the four corners of the second board 51. Accordingly, the top board 37, the second board 51 and the bottom board 43 are simultaneously fixed by aligning the positions of the projecting portions 43a of the bottom board 43 with the positions of the apertures 51a of the second board 51 and of the concaves 37a of the top board 37, and by fastening the screws 52.

A shown in FIG. 2, an upward-oriented edge-connector socket 57 is formed on the second board 51. The edge-connector socket 57 is located at a position opposing to the edge-connector socket 33 of the CPU unit 13. The edge-connector socket 57 is an ordinary electronic device similarly to the edge-connector socket 33, and the riser board 61 hereinafter described can be inserted into the socket 33 and clamped therein. The edge-connector socket 57 includes therein plenty of terminals (not shown) through which the riser board 61 and the second board 51 are electrically connected to each other by means of the contact between the terminals in the edge-connector socket 57 and the terminals of the riser board 61.

An elongated second opening 55 is formed in the top board 37 in line with the upward-oriented edge-connector socket 57. An outward (upward) projecting second guide piece 39 and an inward (downward) projecting third guide piece 53 are formed around the second opening 55. The second guide piece 39 is formed in such a dimension that it is inserted into the first opening 41 of the above CPU unit 13. The front end (bottom end) of the third guide piece 53 is in contact with the second board 51.

Figure 3:
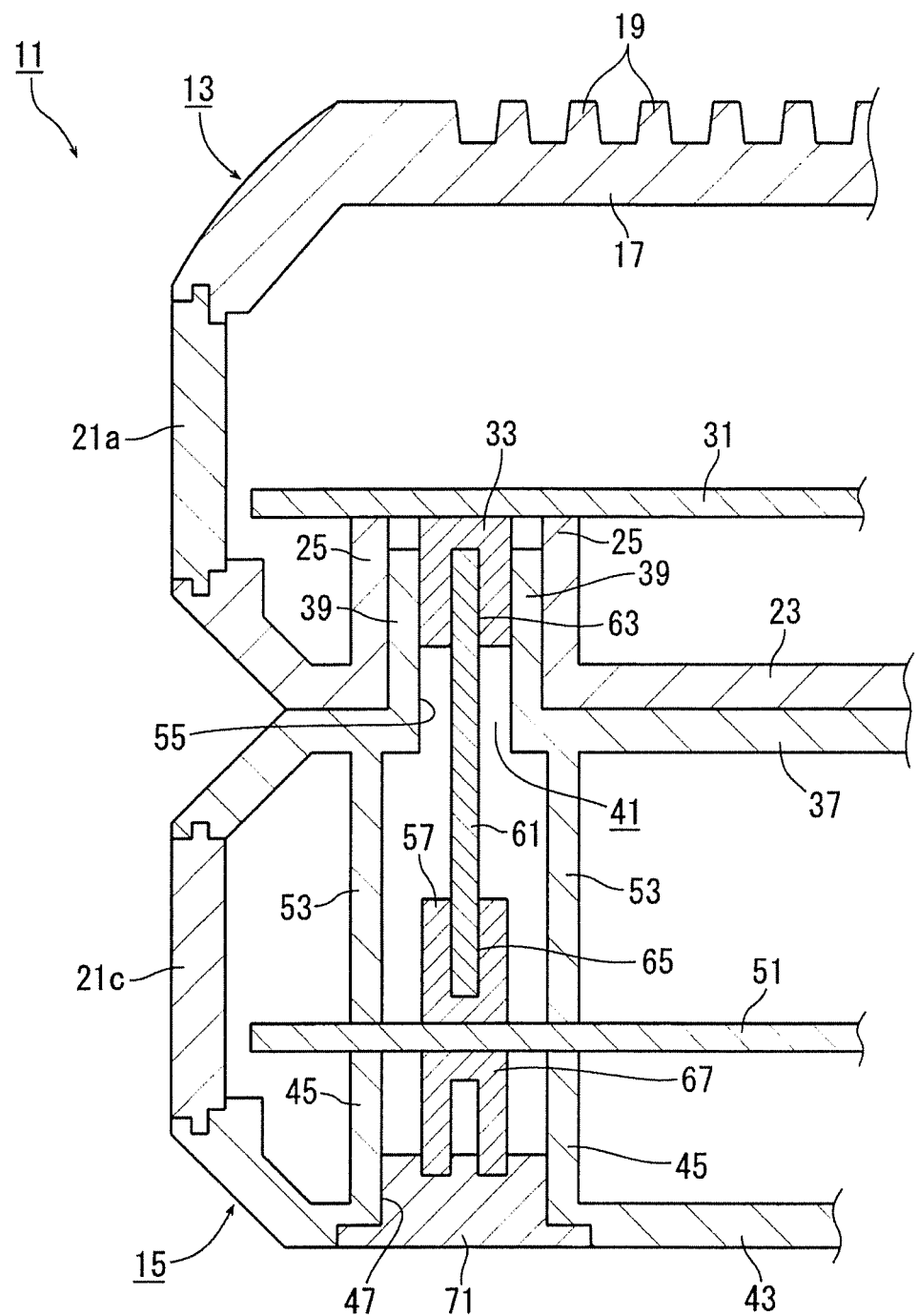
FIG. 3 An enlarged view of a relevant part of FIG. 2.

The riser board 61 is orthogonally fixed to the second board 51. The riser board 61 includes a first edge connector 63 and a second edge connector 65 (refer to FIGS. 3 and 4) at its top end and bottom end, respectively. The first edge connector 63 and the second edge connector 65 are edge portions of a printed circuit board including plenty of terminals, and are insertable into the edge-connector sockets 33, 57, respectively. The riser board 61 having this configuration is fixed while the second edge connector 65 is inserted into the edge-connector socket 57, and the first edge connector 63 is located in the upper end section of the second guide piece 39.

A downward oriented edge-connector socket 67 is mounted on the bottom surface of the second board 51. The downward oriented edge-connector socket 67 is placed on the reverse side of the upward oriented edge-connector socket 57 with respect to the second board 51. A third opening 47 is formed through the bottom plate 43 in line with the position of the downward oriented edge-connector socket 67, and the periphery of the third opening 47 is projected in the upward direction for forming a fourth guide piece 45, which is formed in the same shape as that of the first guide piece 25 of the CPU unit 13. Accordingly, when a projecting portion which is the same shape as that of the second guide piece 39 exists on a position of an additional IO unit 15', which has the same configuration of the IO unit 15, corresponding to the second guide piece 39 of the above IO unit 15, the additional IO unit 15' can be connected to the downside of the IO unit 15 by inserting the above projecting portion into the third opening 47 of the IO unit 15.

A lid 71 made of such as rubber is detachably attached to the third opening 47 which is closed by the lid 71. A dummy trench (concave trench) 73 having a similar shape to that of the opening 47 is formed on the bottom plate 43, and the lid 71 removed from the opening 47 may be fitted to the dummy trench 73.

Figure 4:
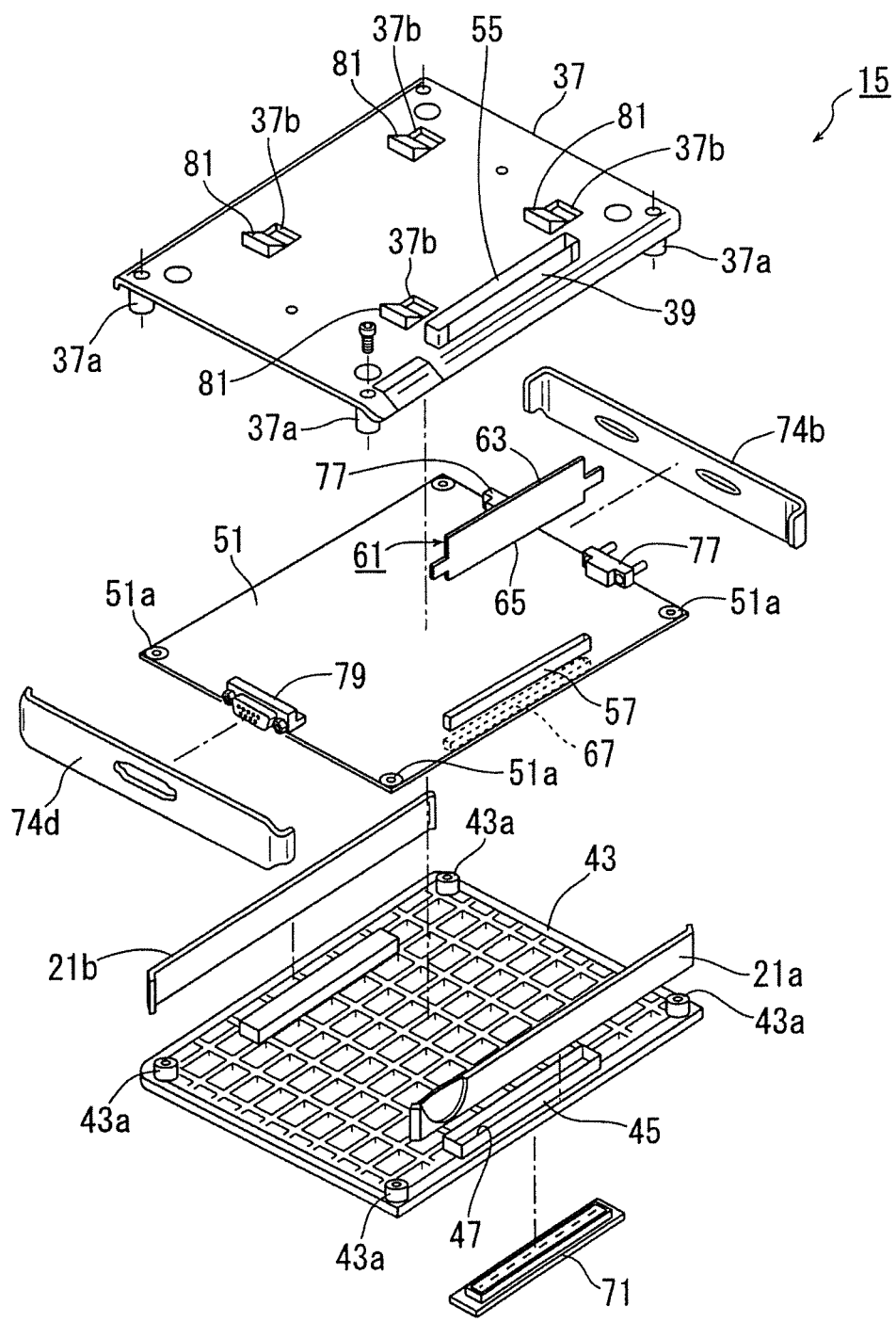
FIG. 4 A partially broken perspective view of an IO unit of the electronic device of FIG. 1 viewed from a direction "B" of FIG. 1 (a movable engagement mechanism is omitted).
Figure 5:
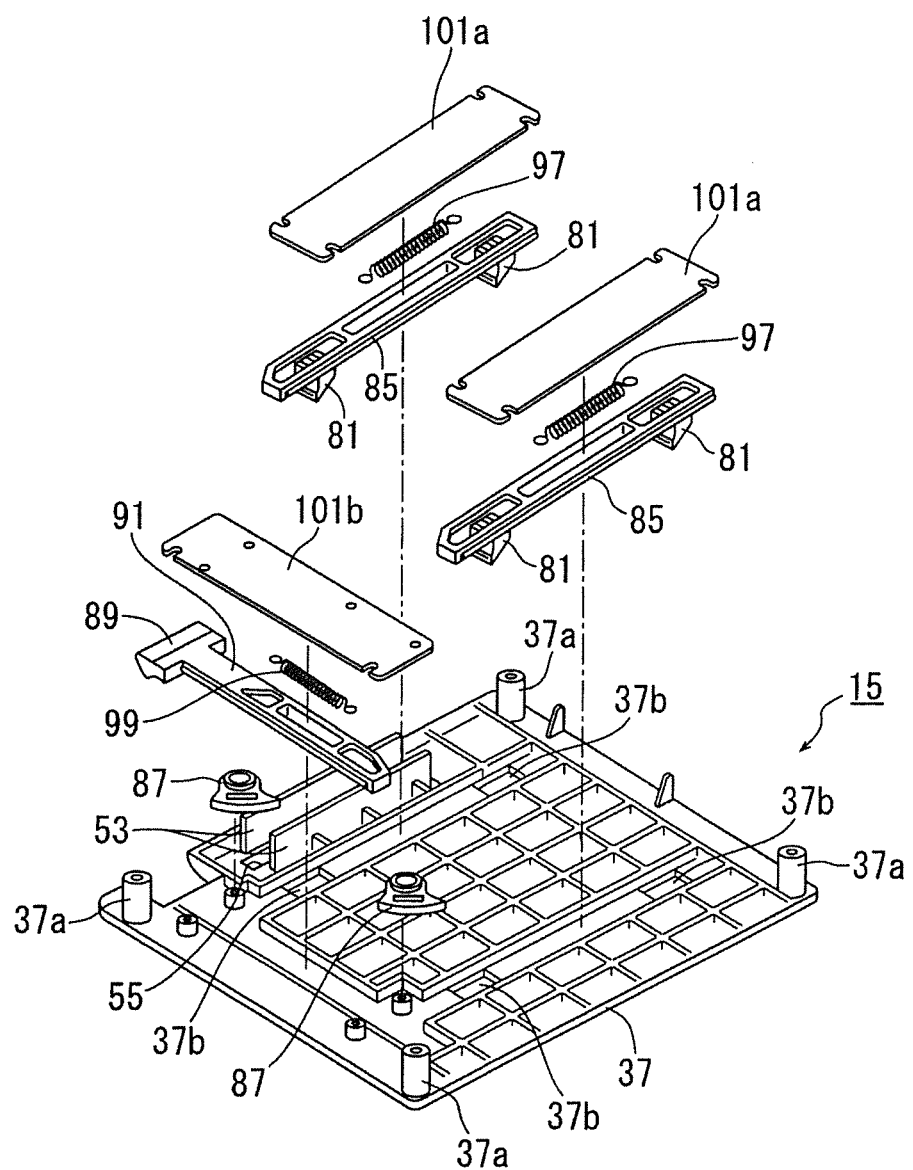
FIG. 5 A partially broken perspective view of the IO unit viewed from a downward direction showing the movable engagement mechanism of the IO unit.

As shown in FIG. 4, four nails 81 are formed on the top board 37 of the IO unit 15. More specifically, four apertures 37b are formed through the top board 37, and the respective nails 81 are positioned through the four apertures 37b from the inside. As shown in FIG. 5, the nails 81 are integrally formed with bars 85, and each of the two nails are formed on each of the two bars 85. The two bars are formed in parallel to each other, and are slidably supported between the top board 37 and thin plates 101a.

Figure 6:
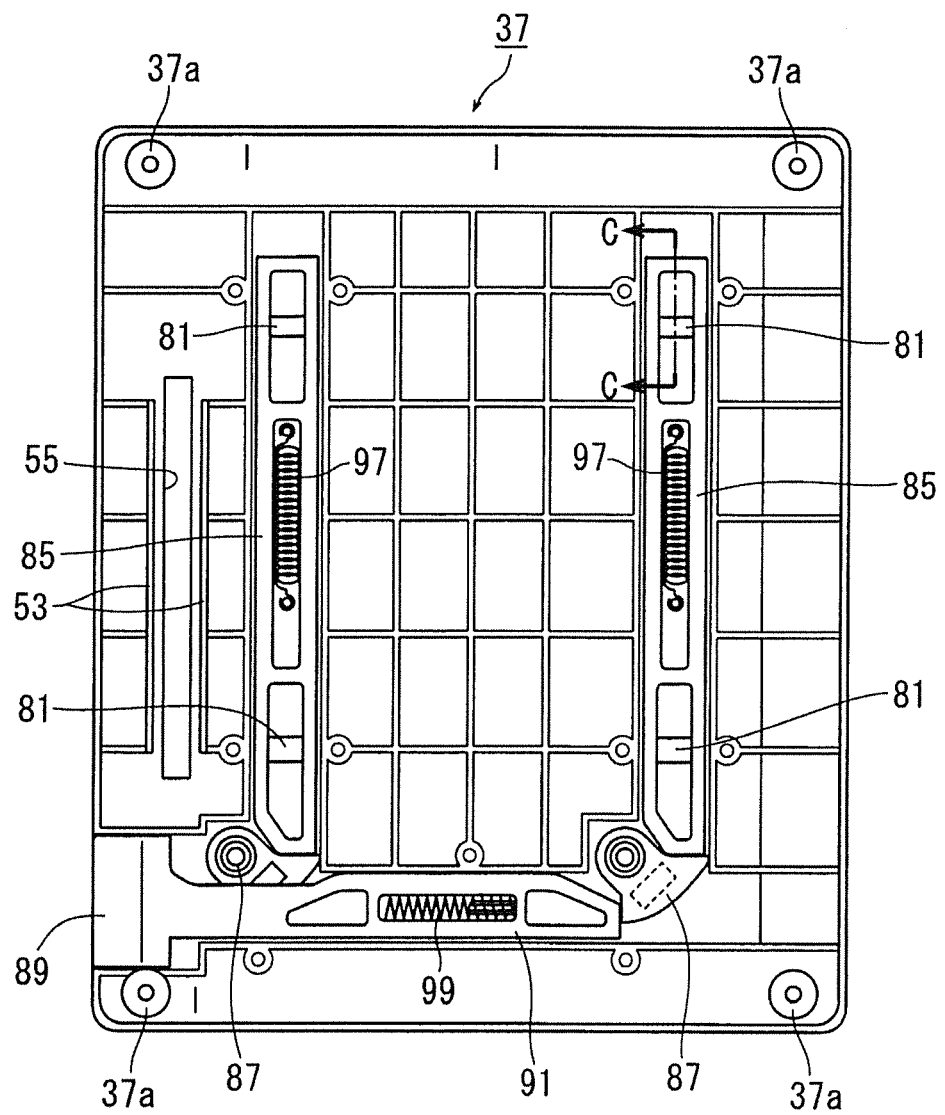
FIG. 6 A bottom view of a top board of the IO unit of the electronic device of FIG. 1.

As shown in FIG. 6, cams 87 are disposed on ends of the respective bars 85. The cam 87 is rotatably supported and is engaged with the bar 85 and an operation lever 91. The operation lever 91 is disposed orthogonally with respect to the bars 85, and slidably supported in a longitudinal direction between the top board 37 and the thin plate 101 (refer to FIG. 5). An operation button 89 is integrally formed at the end of the operation lever 91. When the operation lever 91 is slid to the outermost part of the operation lever 91 (left side of FIG. 6), the operation button 89 forms the same plane with the surface of the housing.

Springs 97 for the bars are connected to the respective bars 85A, and a spring 99 for the lever is connected to the operation lever 91. The bars 85 and the operation lever 91 are energized to the original state (that is, the state in which the operation button 89 forms the same plane with the surface of the housing) by means of these springs 97, 99. When the operation button 89 is pushed against the energizing force (refer to a white arrow of FIG. 7), the operation lever 91 is slid in a back direction to transmit the force through the cams 87, thereby sliding the two bars 85 simultaneously to move the four nails 81 by the same distance in an upward direction of FIG. 6 at the same time. A direction in which the nail 81 moves when the button 89 is operated (right direction of FIG. 7) is defined to be an advance direction while a direction in which the nails return by means of the springs 97, 99 (left direction of FIG. 7) is defined to be a retreat direction.

Figure 7:
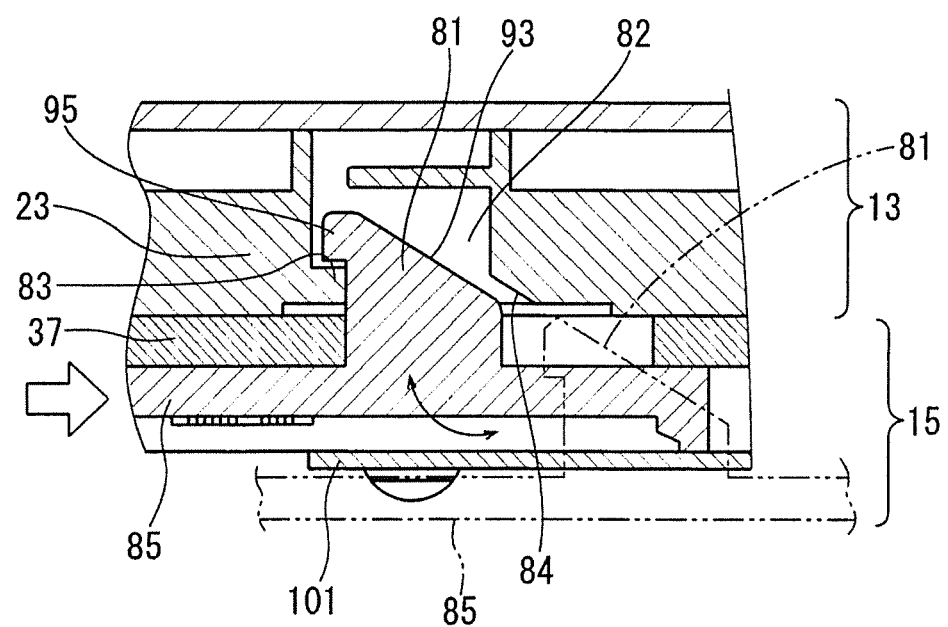
FIG. 7 A sectional view taken along a line C-C of FIG. 6 and displayed upside down.

As shown in the enlarged view of FIG. 7, the nails 81 project in an upward direction above the bars 85. The top surface of the nail 81 is tapered such that the height of the nail increases toward the retreat direction. The top part of the nail 81 projects toward the retreat direction, and a rear end is formed. On the other hand, concaves (engaged sections) 82 are formed through the bottom board 23 of the CPU unit 13 (refer to FIG. 7), The concaves 82 are formed at four positions corresponding to those of the nails 82. A projection 83 formed in the concave 82 engages with a rear end 95 of the nail 81 when the nail 81 retreats. A taper 84 formed in the concave 82 is in contact with the taper 93 of the nail 81 when the nail 81 advances.

As mentioned, the four nails have the same shape, and are configured to simultaneously move by the same distance in the same direction when the button 89 is operated. During the movement of the four nails 81, the four tapers 93 of the nails 81 are simultaneously in contact with the four tapers 84 of the CPU unit 13 to press the CPU unit 13 upward. Accordingly, after the CPU unit 13 moves upward (separated direction) keeping parallel with respect to the IO unit 15, the both are separated. On the other hand, when the four nails 81 move in the retreat direction, the rear ends 95 of the four nails 81 engage with the projections 83 of the concaves 82 so that the CPU unit 13 is firmly fixed to the IO unit 15.

Then, the assembling and the disassembling (unlocking) of the electronic device of the present embodiment having the above configuration will be described.

Before the assembling, the CPU unit 13 and the IO unit 15 are separated, and a riser board 61 is fixed to the IO unit 15 side. At a first stage of assembling these components, the CPU unit 13 and the IO unit 15 are stacked. On this occasion, the bottom board 23 of the CPU unit 13 may be stacked on the top board 37 of the IO unit 15, and the top board 37 of the IO unit 15 disposed upside down may be stacked on the bottom board 23 of the CPU unit 13 reversely disposed. At the time of the stacking, the side surfaces of the both units may be aligned because the both units have substantially the same planar shape. The CPU unit 13 is pressed into the IO unit 15 side (or the IO unit 15 is pressed into the CPU unit 13 side) under the condition that the second guide piece 39 of the above IO unit 15, is inserted into the first opening 41 of the CPU unit 13. In this manner, the first edge connector 63 of the riser board 61 is inserted into the edge-connector sockets 33 of the CPU unit 13 to achieve the electric connection between the both. On this occasion, the nail 81 moves in the concave 82 by means of the springs 97, 99 to be automatically arranged at a position specified with solid lines in FIG. 7.

More specifically, when the CPU unit 13 is stacked on the IO unit 15, the tapers 93 of the nails 81 located on the position specified with imaginary lines of FIG. 7, are in contact with the tapers 84 of the bottom plate 23 of the CPU unit 13 and are pressed so that the nails 81 retreat in the concaves 82 (move in the left direction of FIG. 7). The rear ends 95 of the nails 81 engage with the projections 83 of the concaves 82 so that the CPU unit 13 is firmly connected to the IO unit 15.

The connected state can be visually confirmed in this state because the operation button 89 and the side wall 21a form the same surface. On the contrary, when the operation button 89 and the side wall 21a do not form the same surface (that is, when the operation button 89 comes into the inside of the side wall 21a), the incompleteness of the connection between the both units can be recognized by visually confirming the misalignment.

In order to unlock the connection between the both units 13, 15, the operation button 89 is pressed. This operation moves the four nails 81 simultaneously in the retreat direction by the same distance, and the tapers 93 of the nails 81 press the four tapers 84 of the CPU unit 13 at the same time. In this manner, the CPU unit 13 is pushed upward while keeping the parallel state with respect to the IO unit 15. Accordingly, the first edge connector 63 of the riser board 61 is pulled out from the edge-connector sockets 33 so that the CPU unit 13 is separated from the IO unit 15.

In accordance with this embodiment, the simple operation of the operation button 89 can easily separate the CPU unit 13 from the IO unit 15 with a smaller force. On this occasion, since the separation is conducted while the CPU unit 13 is kept parallel to the IO unit 15, the connection is not damaged and the safety separation is possible. That is, when the connection is conducted using a conventional pin-structured connecter, the connection force increases with the increase of the number of the pins so that the separation procedure may produce the damage. However, in the present embodiment, the safety separation can be conducted keeping the parallel situation.

While the riser board 61 is fix to the IO unit 15, the board 61 may be fixed to the CPU unit 13. The riser board 61 may be fixed to neither of the units 13, 15 and may be inserted into both of the socket 3 of the CPU unit 13 and of the socket 67 of the IO unit 15 for the connection.

While the single IO unit 15 is connected to the CPU unit 13 in the above embodiment, the present invention is not restricted thereto, and the two or more IO units 15 may be connected. As shown with imaginary lines in FIG. 2, an additional IO unit 15' having the same configuration as that of the IO unit 15 is used, and the additional IO unit 15' may be connected to the IO unit 15. In this case, at first, the lid 71 attached to the bottom plate 43 of the IO unit 15 is removed, and fitted to the dummy trench 73 of the bottom plate 43. Then, a second guide piece (not shown) of the above additional IO unit 15' is inserted into the third opening 47 of the IO unit 15 such that the top end of a riser board 61' of the additional IO unit 15' is inserted into the edge-connector socket 67 of the IO unit 15. Thereby, the IO unit 15 and the additional IO unit 15' are connected to each other. In case of unlocking the connection, an operation button (not shown) of the additional IO unit 15' may be operated for the easy separation.

DESCRIPTION OF SYMBOLS

11 . . . electronic device
13 . . . CPU unit (first unit)
15 . . . IO unit (second unit, extension unit)
31 . . . first board
33 . . . downward-oriented edge-connector socket
41 . . . first opening
47 . . . third opening
51 . . . second board
55 . . . second opening
57 . . . upward-oriented edge-connector socket
61 . . . riser board
63, 65 . . . edge connector
67 . . . downward oriented edge-connector socket
71 . . . lid 73 . . . dummy trench (concave trench)
81 . . . nail
82 . . . concave (engaged section)
85 . . . bar
87 . . . cam
89 . . . operation button
91 . . . operation lever

The invention claimed is:

1. An electronic device comprising:
a first unit accommodating a first board;
a second unit accommodating a second board and having a substantially same planar shape as that of the first unit;
a riser board having a pair of edge connectors at both ends, one of which is inserted into a first edge-connecter socket of the first board through a first opening formed in the first unit, and the other of which is inserted into a second edge-connecter socket of the second board through a second opening formed in the second unit, for connecting the first board and the second board;
a plurality of engaged sections formed on one of opposing surfaces of the first unit and the second unit;
a plurality of engaging sections having nails, of which a number is same as those of the engaged sections, formed on the other of the opposing surfaces which can be engaged with the engaged sections; and
an operation button for synchronously sliding the nails, the operation button detaching the respective nails engaged in the engaged sections therefrom, and the respective nails pushing the first unit and the second unit in a direction for separating the both units, together with the above detaching.

2. The electronic device as claimed in claim 1 further comprising a third opening on an opposite of the second opening of the second unit, which is closed with a lid.

3. The electronic device as claimed in claim 2, wherein a concave trench having a same shape as the third opening is formed in the second unit.

4. An extension unit for an electronic device comprising:
a board having an upward-oriented edge-connector socket and a downward-oriented edge-connector socket at top and bottom corresponding positions;
openings above and below the both edge-connector sockets;
a riser board which is inserted into the upward-oriented edge-connector socket, includes edge connectors at both ends and passes through the top opening for extending upward;
a plurality of engaged sections formed on a top surface or a bottom surface of the unit;
a plurality of engaging sections having nails, of which a number is same as those of the engaged sections, formed on the other surface which can be engaged with the engaged sections; and
an operation button for synchronously sliding the plurality of the nails, the operation button detaching the respective nails engaged in the engaged sections therefrom.

* * * * *